United States Patent
Le Prado et al.

(10) Patent No.: US 9,797,966 B2
(45) Date of Patent: Oct. 24, 2017

(54) METHOD AND DEVICE FOR MEASURING A MAGNETIC FIELD BY SYNCHRONISED EXCITATIONS

(71) Applicant: COMMISSARIAT A L'ENERGIE ATOMIQUE ET AUX ENE ALT, Paris (FR)

(72) Inventors: Matthieu Le Prado, Saint Marcellin (FR); Francois Bertrand, La Tronche (FR); Marie-Constance Corsi, Grenoble (FR); Elisabeth Delevoye, Saint Egreve (FR); Sophie Morales, Varces (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 631 days.

(21) Appl. No.: 14/324,379

(22) Filed: Jul. 7, 2014

(65) Prior Publication Data
US 2015/0008916 A1    Jan. 8, 2015

(30) Foreign Application Priority Data
Jul. 8, 2013   (FR) ...................................... 13 56704

(51) Int. Cl.
| | | |
|---|---|---|
| *G01V 3/00* | (2006.01) | |
| *G01R 33/26* | (2006.01) | |
| *G01R 33/04* | (2006.01) | |

(52) U.S. Cl.
CPC ............. *G01R 33/26* (2013.01); *G01R 33/04* (2013.01)

(58) Field of Classification Search
CPC ...................................... G01Q 60/52
USPC .................................. 324/304, 302, 318, 322
See application file for complete search history.

(56) References Cited

U.S. PATENT DOCUMENTS

| | | | | |
|---|---|---|---|---|
| 3,621,382 A | * | 11/1971 | Valet ...................... | G01R 33/05 324/249 |
| 5,004,726 A | * | 4/1991 | Shaulov ............. | G01R 33/1238 324/201 |
| 6,268,725 B1 | * | 7/2001 | Vernon .................. | G01R 33/04 324/253 |
| 7,414,399 B2 | | 8/2008 | Delevoye et al. | |
| 7,476,595 B2 | | 1/2009 | Moriceau et al. | |

(Continued)

OTHER PUBLICATIONS

U.S. Appl. No. 14/856,950, filed Sep. 17, 2015, Le Prado, et al.

(Continued)

*Primary Examiner* — Louis Arana
(74) *Attorney, Agent, or Firm* — Oblon, McClelland, Maier & Neustadt, L.L.P.

(57) ABSTRACT

The invention relates to a magnetic field measurement device, including a detector (4) configured to measure the amplitude of an output signal at a harmonic of an oscillation frequency of an excitation source, said amplitude being proportional to the magnetic field (B) to be measured, characterised in that it comprises an excitation circuit configured to associate with a principal excitation source ($B_1 \cos\omega t$) oscillating at a principal oscillation frequency at least one secondary excitation source ($B_2 \cos(\omega/3t + \Phi_2)$) oscillating at a secondary oscillation frequency that is a fraction of the principal oscillation frequency, said fraction being odd if said harmonic is odd, and even if said harmonic is even.

8 Claims, 2 Drawing Sheets

(56) References Cited

U.S. PATENT DOCUMENTS

| | | | |
|---|---|---|---|
| 7,541,263 | B2 | 6/2009 | Moriceau et al. |
| 7,637,155 | B2 | 12/2009 | Delevoye |
| 7,675,217 | B2 | 3/2010 | Delevoye et al. |
| 7,781,300 | B2 | 8/2010 | Moriceau et al. |
| 8,039,285 | B2 | 10/2011 | Souriau et al. |
| 8,154,349 | B2 | 4/2012 | Le Prado et al. |
| 8,183,942 | B2 | 5/2012 | Le Prado et al. |
| 8,525,516 | B2 | 9/2013 | Le Prado et al. |
| 2011/0226065 | A1 | 9/2011 | Lebental et al. |
| 2012/0261076 | A1 | 10/2012 | Moriceau et al. |
| 2013/0150702 | A1 | 6/2013 | Hokari |
| 2014/0168550 | A1 | 6/2014 | Rossini et al. |

OTHER PUBLICATIONS

U.S. Appl. No. 14/345,510, filed Mar. 18, 2014, Delevoye, et al.
U.S. Appl. No. 14/353,883, filed Apr. 24, 2014, Moriceau, et al.
U.S. Appl. No. 14/362,501, filed Jun. 3, 2014, Morales, et al.
U.S. Appl. No. 14/324,379, filed Jul. 7, 2014, Le Prado, et al.
J. Dupont-Roc, "Étude Théorique De Diverses Résonances Observables En Champ Nul Sur Des Atomes "Habillés" Par Des Photons De Radiofréquence", Le Journal De Physique, vol. 32, No. 2-3, XP 055105763, Feb. 1971, pp. 135-144 (reference previously filed, submitting Statement of Relevancy only).
French Preliminary Search Report dated Mar. 7, 2014, in Patent Application No. FR 1356704, dated Jul. 8, 2013 (with English Translation of Category of Cited Documents).
James E. Lenz, "Magnetic Sensors", Scientific Honeyweller, vol. 6, No. 1, XP 001425001, Apr. 1985, pp. 16-25.
Jen-Tzong Jeng, et al., "Enhancement in Sensitivity Using Multiple Harmonics for Miniature Fluxgates", IEEE Transactions on Magnetics, vol. 48, No. 11, XP 011468925, Nov. 2012, pp. 3696-3699.
Juan Carlos Cruz, et al., "Design of a fourth harmonic fluxgate magnetometer", Sensors and Actuators, vol. 78, No. 2-3, XP 004252953, Dec. 14, 1999, pp. 71-73.
H C Kim, et al., "A new method for fluxgate magnetometers using the coupling property of odd and even harmonics", Measurement Science and Technology, vol. 6, No. 7, XP 000521534, Jul. 1995, pp. 898-903.
F. Primdahl, "The fluxgate magnetometer", Journal of Physics E. Scientific Instruments, vol. 12, No. 4, XP 001423559, Apr. 1979, pp. 241-253.
J. Dupont-Roc, "Étude Théorique De Diverses Résonances Observables En Champ Nul Sur Des Atomes "Habillés" Par Des Photons De Radiofréquence", Le Journal De Physique, vol. 32, No. 2-3, XP 055105763, Feb.-Mar. 1971, pp. 135-144.

\* cited by examiner

METHOD AND DEVICE FOR MEASURING A MAGNETIC FIELD BY SYNCHRONISED EXCITATIONS

TECHNICAL FIELD

The field of the invention is that of magnetometers for which the measurement of a magnetic field includes measurement of the amplitude of a signal at a harmonic of an oscillation frequency of an excitation source. The invention is more particularly applicable to saturated core magnetometers and to zero-field parametric resonance atomic magnetometers.

STATE OF PRIOR ART

Magnetometers are known in which the measurement principle is based on the use of one among several harmonics generated by an excitation source.

For example, this is the case for saturated core type magnetometers (also known as "fluxgate" magnetometers) in which an alternating excitation current is applied to an excitation coil surrounding a magnetic core. The magnetic field to be measured induces current pulses in a detection coil that also surrounds the magnetic core, said pulses being resonant at harmonics of the frequency of the excitation current. The amplitude of even harmonics is proportional to the field to be measured.

This is also the case for zero-field parametric resonance atomic magnetometers. These magnetometers use a cell filled with a gas of atoms, a laser source that emits a polarised beam towards the cell along a propagation direction, and a photodetector capable of outputting an output signal representative of the beam that passed through the cell. A coil surrounds the cell, powered by a frequency generator to generate a sinusoidal magnetic excitation field perpendicular to said propagation direction and parallel to the field to be measured.

It is possible to find a description of the operating principle of such atomic magnetometers in the article by J. Dupont-Roc, entitled "Etude théorique de diverses résonances observables en champ nul sur des atomes "habillés" par des photons de radiofréquence", Le journal de physique, Volume 32, February 1971, p135.

The signal S captured by the photodetector includes several harmonics, the expressions of which are $$S = J_0 M + \sum_{q \geq 1}(2J_{2q}\cos 2q\omega t)\cdot M - \sum_{q \geq 0}(2J_{2q+1}\cos(2q+1)\omega t)\cdot N,$$

where $$M = \frac{\lambda J_0}{\Gamma}\frac{\Gamma^2 + \omega_x^2}{\Gamma^2 + \omega_x^2 + \omega_y^2 + \omega_z^2},$$

$$N = \frac{\lambda J_0}{\Gamma}\frac{\Gamma \omega_z + \omega_x \omega_y}{\Gamma^2 + \omega_x^2 + \omega_y^2 + \omega_z^2},$$

$\omega_i$ is the magnetic field on the i axis multiplied by $\gamma$, the gyromagnetic ratio of the energy level considered for the atom, $\lambda$ describes the orientation induced by optical pumping, $1/\gamma$ is the relaxation time of the energy level considered for the atom, $J_n$ is the n order Bessel function with argument $$\frac{\gamma B_1}{\omega}.$$

S more particularly contains odd resonances at frequencies $$\frac{(2q+1)\omega}{2\pi}$$

(where q is a positive or zero integer) proportional to the magnetic field to be measured on the z axis.

All that is actually processed is resonance at the frequency of the excitation field $\omega/2\pi$, and the other harmonics are not used. This resonance is present in a weak magnetic field $\omega_i < \Gamma$, where $i \in \{x, y, z\}$. It is used to measure a weak magnetic field either knowing the gradient of the resonance about Bz=0, or by slaving a magnetic compensation field Bc for which the amplitude is adjusted such that the sum Bc+Bz is always kept equal to zero. In this way, knowledge of the current Ic injected into the coil to apply the compensation field provides a means of knowing Bz because Bc=−Bz.

Laser optical pumping and detection methods may be adjusted (for example by the pressure of the gas forming the cell), so as to reduce the magnetometer noise: in general it is always desirable to increase the sensitivity of the measurement and to aim at a better signal-to-noise ratio.

PRESENTATION OF THE INVENTION

The purpose of the invention is to provide a solution to this need and the invention discloses for this purpose a magnetic field measurement device including a detector configured to measure the amplitude of an output signal at a harmonic of an oscillation frequency of an excitation source, said amplitude being proportional to the magnetic field to be measured, characterised in that it comprises an excitation circuit configured to associate with a principal excitation source oscillating at a principal oscillation frequency at least one secondary excitation source oscillating at a secondary oscillation frequency that is a fraction of the principal oscillation frequency, said fraction being odd if said harmonic is odd, and even if said harmonic is even.

Some preferred non-limitative aspects of this device are as follows:

The device is a zero-field parametric resonance atomic magnetometer;

It includes:
  a cell filled with a gas;
  a laser source capable of emitting an optical pumping beam polarised in the direction of the cell along a propagation direction;
  a coil surrounding the cell and a frequency generator powering the coil, the coil and the generator forming said excitation circuit,
  a photodetector capable of outputting a signal representative of the beam that passed through the cell forming said output signal,
  the excitation circuit being configured to associate magnetic fields comprising a principal sinusoidal magnetic excitation field and at least one secondary sinusoidal magnetic excitation field at a secondary frequency that is an odd fraction of the principal frequency.

said harmonic is the fundamental of the principal oscillation frequency;

it also comprises a slaving circuit configured to inject a current into the coil so as to generate a compensating magnetic field creating a zero sum with the magnetic field to be measured;

the detector is a synchronous detector tuned to said harmonic;

The magnetometer is of the saturated core magnetometer type;

the excitation circuit is configured to associate alternating excitation currents output to an excitation coil surrounding a magnetic core, and the at least one secondary frequency is an even fraction of the principal oscillation frequency;

said harmonic is an order 2 or order 4 harmonic of the principal oscillation frequency.

According to another aspect, the invention relates to a method of measuring a magnetic field making use of a measurement of the amplitude of a signal at a harmonic of an oscillation frequency of an excitation source, said amplitude being proportional to the magnetic field to be measured, characterised by the association of a principal excitation source oscillating at a principal oscillation frequency and of at least one secondary excitation source oscillating at a secondary oscillation frequency that is a fraction of the principal oscillation frequency, said fraction being odd if said harmonic is odd and even if said harmonic is even.

BRIEF DESCRIPTION OF THE DRAWINGS

Other aspects, purposes, advantages and characteristics of the invention will become clear after reading the following detailed description of preferred embodiments of the invention given as non-limitative examples with reference to the appended drawings in which.

DETAILED PRESENTATION OF PARTICULAR EMBODIMENTS

A first aspect of the invention concerns a magnetic field measurement device comprising a detector configured to measure the amplitude of an output signal at a harmonic of an oscillation frequency of an excitation source, said amplitude being proportional to the magnetic field to be measured.

In a first embodiment, the device is a zero-field parametric resonance atomic magnetometer comprising:

a cell filled with a gas;

a laser source capable of outputting an optical pumping beam polarised in the direction of the cell along a propagation direction;

a coil surrounding the cell and a frequency generator supplying power to the coil, the coil and the generator forming an excitation circuit, a photodetector capable of outputting a signal representative of the beam that passed through the cell forming said output signal.

Figure 1:
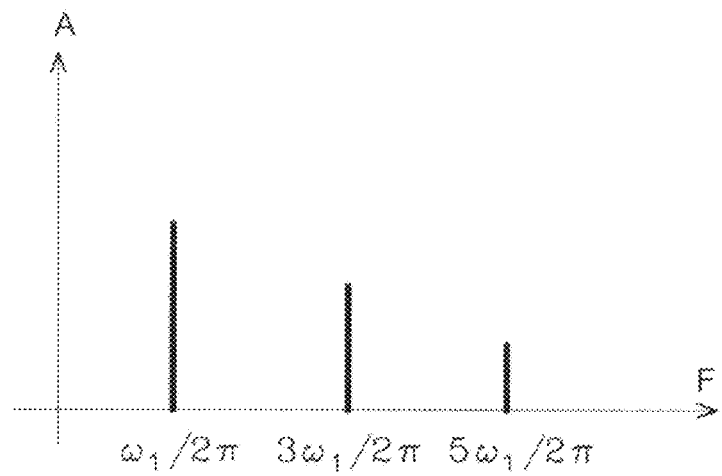
FIG. 1 is a diagram showing the amplitude of harmonics proportional to the magnetic field to be measured resulting from a conventional excitation.

With a conventional excitation, the frequency generator powers the coil to generate a sinusoidal magnetic excitation field $B1\cos\omega1t$ perpendicular to said propagation direction if the laser is in circular polarisation, or perpendicular to the polarisation if the laser is in straight polarisation. As shown in FIG. 1, the signal captured by the photodetector is resonant at harmonics of the frequency of the magnetic excitation field, the resonant amplitude A at odd harmonics $\omega1/2\pi$, $3\omega1/2\pi$, $5\omega1/2\pi$, etc. being proportional to the magnetic field to be measured. As also shown in FIG. 1, the maximum of odd resonant amplitudes at frequencies $$\frac{(2q+1)\omega_1 t}{2\pi}$$

decreases as the order (2q+1) of the harmonics, where q is an integer, increases.

It could be envisaged to make use of several odd harmonics in order to increase the energy of the signal. However, the result would always be a concomitant increase in the noise level.

The invention proposes a different approach, namely to configure the excitation circuit to associate with a principal excitation source oscillating at a principal oscillation frequency at least one secondary excitation source oscillating at a secondary oscillation frequency that is a fraction of the principal oscillation frequency, said fraction being odd if said harmonic at which the amplitude proportional to the field to be measured is studied is odd, and even if said harmonic is even.

Returning to the example of the atomic magnetometer, the frequency generator is thus configured to supply power to the coil so as to generate a combination of colinear magnetic excitation fields $\Sigma Bi\cos\omega it$, for which the frequencies $\omega i/2\pi$ are odd sub-multiples of a reference frequency. Thus, several signals are superposed at a single frequency without increasing the noise energy.

Figure 2:
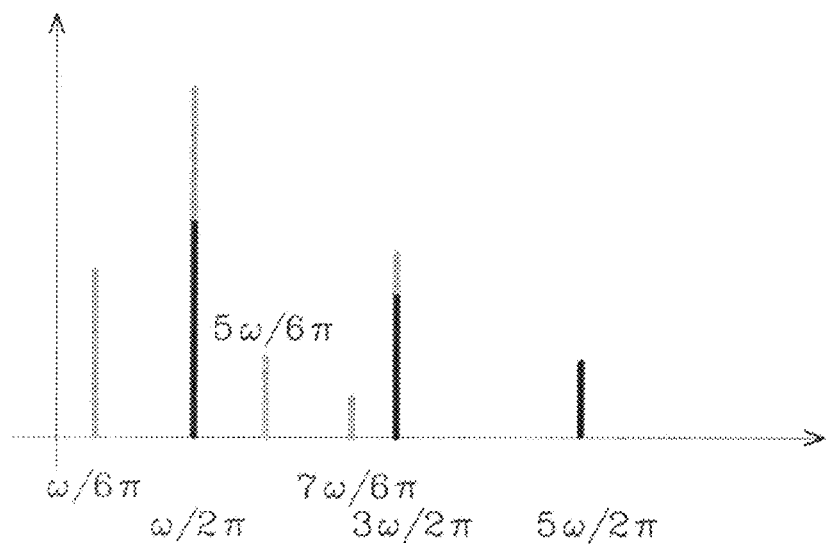
FIG. 2 is a diagram showing the amplitude of harmonics proportional to the magnetic field to be measured resulting from an excitation according to the invention.

FIG. 2 is a diagram illustrating the amplitude of harmonics proportional to the magnetic field to be measured resulting from excitation according to the invention with a principal magnetic excitation field $B1\cos\omega1t$ and a secondary magnetic excitation field $B2\cos(\omega2t+\phi_2)$, where $\omega2=\omega1/3$.

The resonant amplitudes of the signal captured by the photodetector at odd harmonics of the principal frequency and of the secondary frequency are proportional to the magnetic field to be measured. Thus in particular, two peaks are superposed at $\omega1/2\pi=3\omega2/2\pi$ that consist of the resonant amplitude A of the signal at the fundamental harmonic (order 1) of the principal oscillation frequency and the resonant amplitude of the signal at the order 3 harmonic of the secondary oscillation frequency. This superposition results in an increase in the signal level and therefore the signal-to-noise ratio.

In order to maximise the 2 resonant amplitudes observed at $\omega1/2\pi$, the set of impacting parameters, i.e.

$$\left\{\frac{\gamma B_1}{\omega 1}; \frac{\gamma B_2}{\omega 1/3}\right\},$$

that optimises the resonant amplitude at frequency $\omega1/2\pi$ has to be found.

In one embodiment, other secondary excitations at secondary frequencies $\omega3=\omega1/5$, $\omega4=\omega1/7$, etc. are also added, so as to benefit from the contribution of their order 5, 7, harmonics etc. However, these contributions become weaker as the order to be considered for a contribution at ω1/2π increases.

Empirically, it is firstly possible to apply the principal excitation (for which the frequency is highest) B1cosω1t for which the ratio $$\frac{\gamma B_1}{\omega_1}$$

is adjusted (around 1) as a function of a maximum value of Sω1 (component of signal S at frequency ωw1), so as to limit the time to find functional optimums. The next step is to apply the secondary excitation for which the frequency is adjusted to obtain a resonant peak at its order 3 (or 5, 7, etc. if applicable) harmonic slightly offset from the resonant peak of the fundamental harmonic of the principal excitation. The ratio $$\frac{\gamma B_2}{\omega_2}$$

is then adjusted. The next step is then to tune the secondary excitation frequency precisely until resonant peaks are superposed and the phase $\omega_2$ is then adjusted. Application of the secondary excitation will modify the optimum setting $$\frac{\gamma B_1}{\omega_1}$$

slightly, that can then be corrected. This procedure is continued to add additional low frequency secondary modulations.

Figure 3:
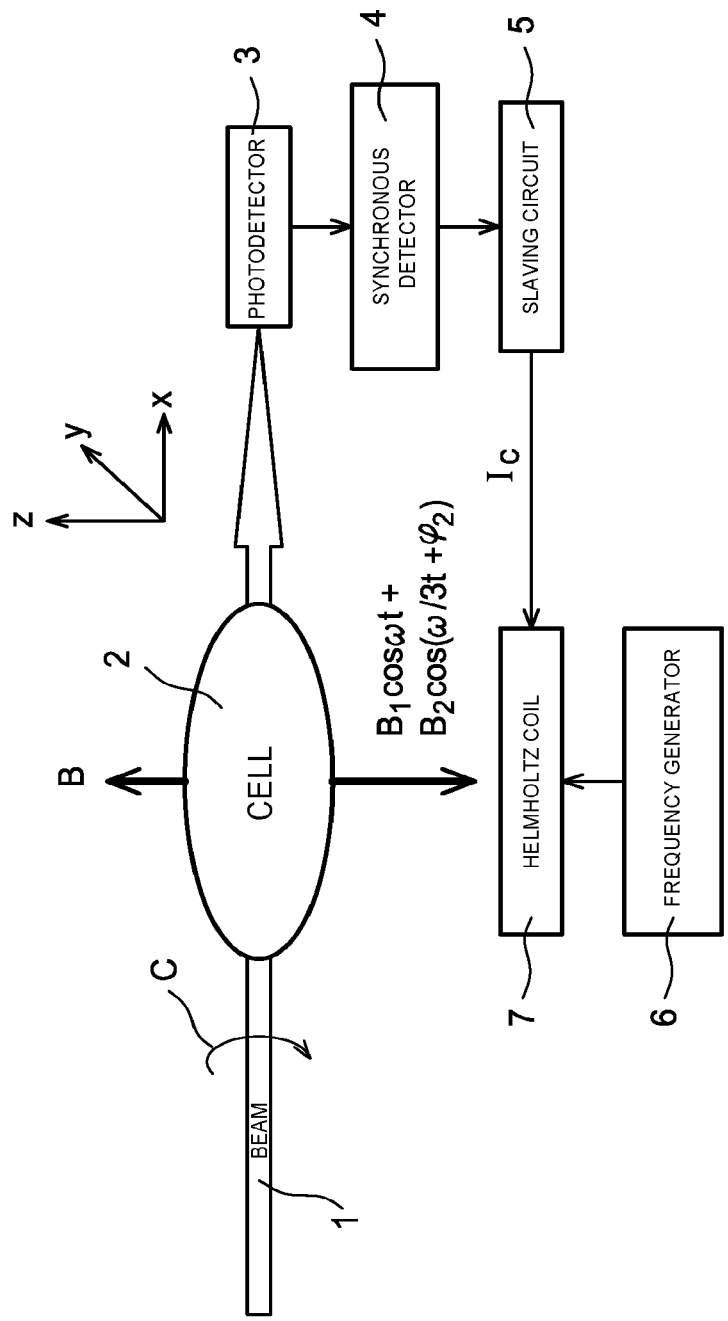
FIG. 3 is a diagram showing a zero-field parametric resonance atomic magnetometer conforming with one possible embodiment of the invention.

FIG. 3 shows an example embodiment of a device according to this possible embodiment of the invention. The device comprises a laser emitting a beam 1 at a wavelength of 1083 nm, a circular polariser C outputting a circularly polarised beam, a 5 cm³ cell 2 filled with helium 4 at a pressure of 100 mPa, a photodetector 3 into which the beam passes after passing through the cell 2, and a synchronous detector 4 adjusted to ω/2π outputting the modulus of the field B to be measured. The device comprises a slaving circuit 5 outputting a current Ic that is injected into the Helmholtz coils 7 so as to generate a magnetic compensation field Bc such that the sum Bc+B is continuously held equal to zero. It also comprises a frequency generator 6 that powers the coils 7 in order to generate the magnetic excitation field $B_1\cos\omega t + B_2\cos(\omega 3t+\phi_2)$ resulting from the combination of a principal sinusoidal magnetic excitation field at ω/2π and a secondary sinusoidal magnetic excitation field, in this case at ω/6π and with a phase shift of $\phi_2$. An RF discharge circuit also creates a high frequency electrostatic discharge between two electrodes placed in the cell 2.

For example, one example embodiment consists of adopting the following settings for the helium 4 gas cell:

$$\frac{\gamma B_1}{\omega_1} = 1$$

and

-continued $$\frac{\gamma B_2}{\omega 1/3} = 4(\gamma/2\pi = 28 \text{ Hz/nT}$$

for helium 4).

ω/2π is chosen to be equal to 40 kHz (the frequencies of the excitation fields being greater than the relaxation frequency of the magnetically sensitive energy level) and B1=1400 nT and B2=1900 nT.

The RF discharge circuit may for example be controlled to apply an electric field at 10 MHz, 50 mW to the helium 4 through the two electrodes in order to populate the magnetically sensitive energy level.

The addition of the secondary excitation at a 3 times lower frequency ω/6π allows to double the resonant amplitude A at frequency ω/2π. This directly results in magnetometer noise in magnetic field units (T/√Hz) being halved.

In a second embodiment, the device is a saturated core type magnetometer in which the excitation circuit is configured to associate alternating excitation currents supplied to an excitation coil surrounding a magnetic core, namely a principal excitation current at a principal excitation frequency and at least one secondary excitation current at a secondary oscillation frequency that is an even fraction of the principal oscillation frequency. In this embodiment, an attempt is made to superpose peaks at the order 2 or order 4 harmonic level of the principal oscillation frequency.

The invention is not limited to the first aspect of the device, it also extends to cover a method of measuring a magnetic field making use of a measurement of the amplitude of a signal at a harmonic of an oscillation frequency of an excitation source, said amplitude being proportional to the magnetic field to be measured, characterised by association of a principal excitation source oscillating at a principal oscillation frequency with at least one secondary excitation source oscillating at a secondary oscillation frequency that is a fraction of the principal oscillation frequency, said fraction being odd if said harmonic is odd, and even if it is even.

It will be realised that the invention is particularly relevant for applications that require excellent sensitivity, for example as is the case particularly for medical applications such as magnetocardiography or magnetoencephalography.

The invention claimed is:

1. A magnetic field measurement device, comprising:
   a cell filled with a gas;
   a laser source configured to emit a polarized optical pumping beam towards the cell along a propagation direction;
   a magnetic resonance excitation circuit comprising a principal excitation source configured to oscillate at a principal oscillation frequency and at least one secondary excitation source configured to oscillate at a secondary oscillation frequency that is a fraction 1/n of the principal oscillation frequency;
   a detector configured to measure an amplitude of an output signal at a harmonic of the principal oscillation frequency, said amplitude being proportional to the magnetic field to be measured,
   wherein the detector is a photodetector configured to output as said output signal a signal representative of the beam that passed through the cell, and
   the magnetic resonance excitation circuit comprises a coil surrounding the cell and a frequency generator powering the coil, the magnetic resonance excitation circuit being configured to associate magnetic fields comprising a principal sinusoidal magnetic excitation field at the principal oscillation frequency and at least one secondary sinusoidal magnetic excitation field at the secondary oscillation frequency, n being odd.

2. The device according to claim 1, wherein said harmonic is the fundamental of the principal oscillation frequency.

3. The device according to claim 1, further comprising a slaving circuit configured to inject a current into the coil so as to generate a compensating magnetic field creating a zero sum with the magnetic field to be measured.

4. The device according to claim 1, wherein the detector is a synchronous detector tuned to said harmonic.

5. A magnetic field measurement device, comprising:
a magnetic resonance excitation circuit comprising a principal excitation source configured to oscillate at a principal oscillation frequency and at least one secondary excitation source configured to oscillate at a secondary oscillation frequency that is a fraction 1/n of the principal oscillation frequency;
a detector configured to measure an amplitude of an output signal at a harmonic of the principal oscillation frequency, said amplitude being proportional to the magnetic field to be measured,
wherein the magnetic resonance excitation circuit is configured to associate alternating excitation currents output to an excitation coil surrounding a magnetic core, wherein the alternating excitation currents comprise a principal excitation current at the principal oscillation frequency and at least one secondary excitation current at the secondary oscillation frequency, and wherein n is even.

6. The device according to claim 5, wherein said harmonic is the order 2 or order 4 harmonic of the principal oscillation frequency.

7. A method of measuring a magnetic field, said method comprising:
emitting, from a laser source, a polarized pumping beam towards a cell filled with gas along a propagation direction;
operating a magnetic resonance excitation circuit which comprises a coil surrounding the cell and a frequency generator that powers the coil to associate magnetic fields comprising a principal sinusoidal magnetic excitation field at a principal oscillation frequency and at least one secondary sinusoidal magnetic excitation field at a secondary oscillation frequency that is a fraction 1/n of the principal oscillation frequency, n being odd,
measuring an amplitude of a signal at a harmonic of said principal oscillation frequency, said amplitude being proportional to the magnetic field to be measured,
wherein the measurement of the amplitude of the signal is performed by a photodetector that outputs a signal representative of the beam that passed through the cell.

8. A method of measuring a magnetic field, said method comprising:
operating a magnetic resonance excitation circuit to supply an excitation coil surrounding a magnetic core with a principal excitation current at a principal oscillation frequency and at least one secondary excitation current at a secondary oscillation frequency that is a fraction 1/n of the principal oscillation frequency, n being even; and
measuring, using a detection coil surrounding the magnetic core, an amplitude of a signal at a harmonic of said principal oscillation frequency, said amplitude being proportional to the magnetic field to be measured.

* * * * *